(12) United States Patent
Baloglu et al.

(10) Patent No.: US 8,986,806 B1
(45) Date of Patent: Mar. 24, 2015

(54) WARPAGE CONTROL STIFFENER RING PACKAGE AND FABRICATION METHOD

(75) Inventors: Bora Baloglu, Chandler, AZ (US); Jeff Watson, Phoenix, AZ (US)

(73) Assignee: Amkor Technology, Inc.

( * ) Notice: Subject to any disclaimer, the term of this patent is extended or adjusted under 35 U.S.C. 154(b) by 319 days.

(21) Appl. No.: 13/452,006

(22) Filed: Apr. 20, 2012

(51) Int. Cl.
*H01L 21/00* (2006.01)
*H01L 23/10* (2006.01)
*H01L 23/00* (2006.01)

(52) U.S. Cl.
USPC .............................. 428/81; 257/433; 257/678

(58) Field of Classification Search
USPC ..................... 428/81; 257/678, 433
See application file for complete search history.

(56) References Cited

U.S. PATENT DOCUMENTS

| | | | |
|---|---|---|---|
| 3,384,400 A * | 5/1968 | Sandhagen | ..................... 403/30 |
| 7,045,890 B2 | 5/2006 | Xie et al. | |
| 7,482,686 B2 | 1/2009 | Zhao et al. | |
| 7,550,845 B2 | 6/2009 | Zhao et al. | |
| 8,008,133 B2 | 8/2011 | Tosaya et al. | |

FOREIGN PATENT DOCUMENTS

JP   2006-013029   1/2006

\* cited by examiner

*Primary Examiner* — Brent O'Hern
(74) *Attorney, Agent, or Firm* — McAndrews, Held & Malloy, Ltd.

(57) ABSTRACT

A warpage control stiffener ring package includes a substrate having an upper surface and corners. A segmented stiffener ring is formed of "L" shaped segments, each segment being mounted to the upper surface at a corner of the substrate, wherein a gap exists between each of the segments. By forming the segmented stiffener ring of segments having gaps therebetween, warpage of the segmented stiffener ring itself, and thus the thermal stress applied by the segmented stiffener ring on to the substrate, is reduced as compared to a continuous stiffener ring. This allows the segmented stiffener ring to be designed to minimize warpage of the warpage control stiffener ring package.

23 Claims, 7 Drawing Sheets

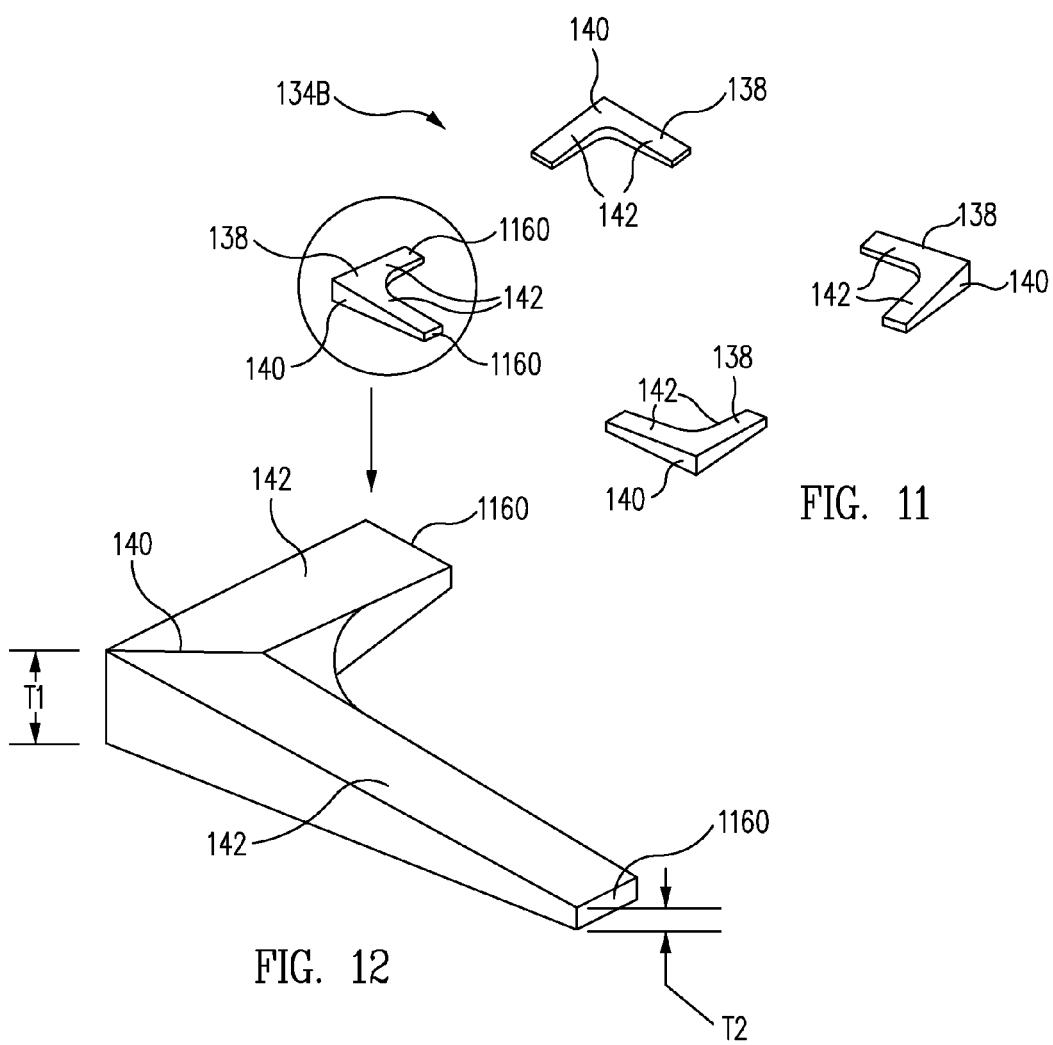

WARPAGE CONTROL STIFFENER RING PACKAGE AND FABRICATION METHOD

TECHNICAL FIELD

The present application relates to the field of electronics, and more particularly, to methods of forming electronic component packages and related structures.

BACKGROUND

Electronic component packages are subject to a wide range of temperature differentials. Due to differences in the thermal coefficient of expansion (TCE) of the various package components, the electronic component package warps as the temperature of the electronic component package changes.

To control this warpage, stiffener rings are incorporated into the electronic component package. The stiffener rings provide extra support to the electronic component package thus reducing warpage. However, the stiffener rings themselves warp as the temperature of the electronic component package changes. This warpage of the stiffener rings contributes to the overall warpage of the electronic component package.

BRIEF DESCRIPTION OF THE DRAWINGS

FIG. 11 is a side perspective view of a segmented stiffener ring in accordance with another embodiment; and FIG. 12 is an enlarged perspective view of a segment of the segmented stiffener ring of FIG. 11 in accordance with one embodiment.

In the following description, the same or similar elements are labeled with the same or similar reference numbers.

DETAILED DESCRIPTION

Figure 1:
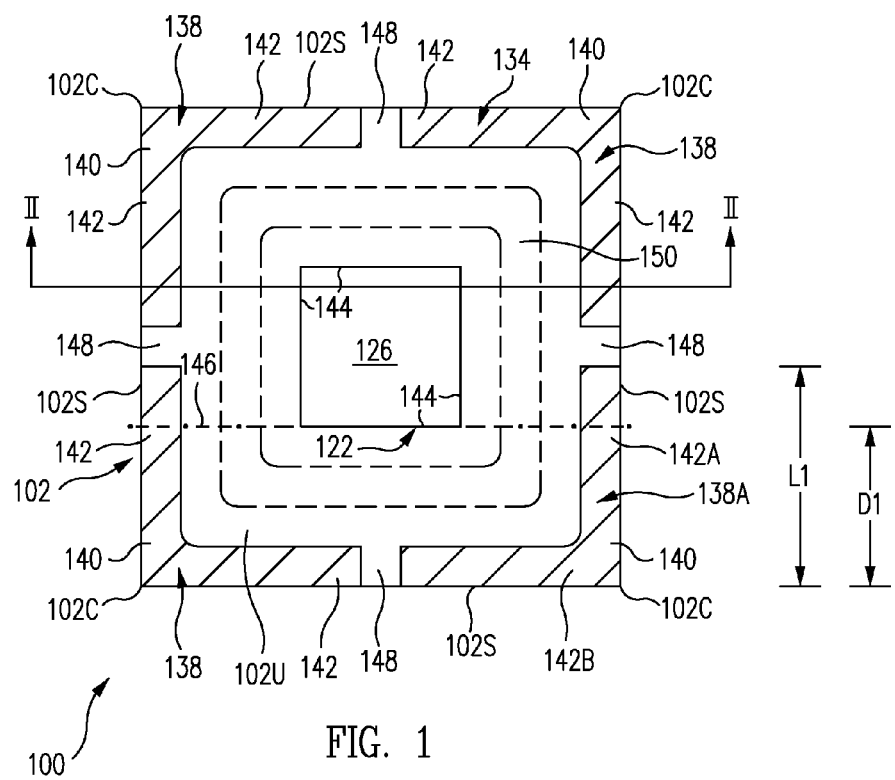
FIG. 1 is top plan view of a warpage control stiffener ring package in accordance with one embodiment.
Figure 2:
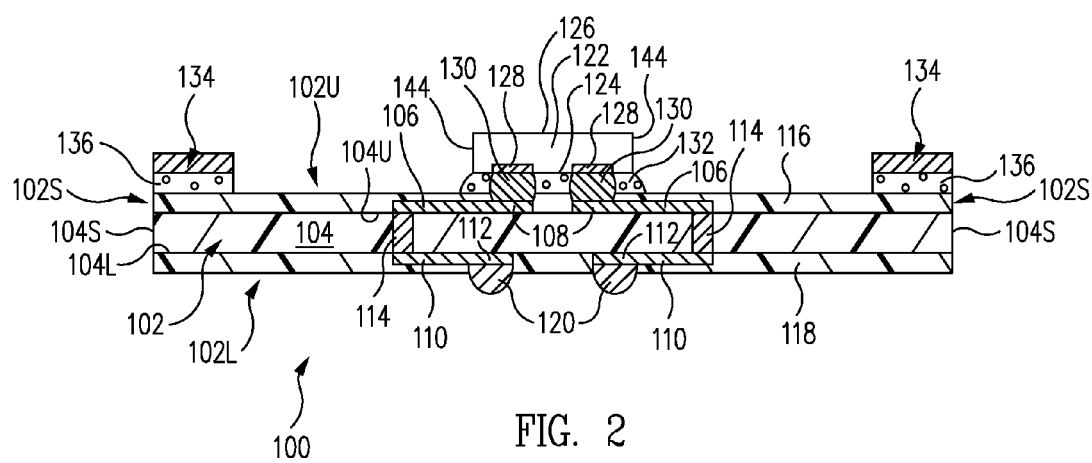
FIG. 2 is a cross sectional view of the warpage control stiffener ring package of FIG. 1 along the line II-II in accordance with one embodiment.

As an overview and in accordance with one embodiment, referring to FIGS. 1 and 2 together, a warpage control stiffener ring package 100 includes a substrate 102 having an upper surface 102U and corners 102C. A segmented stiffener ring 134 is formed of "L" shaped segments 138, each segment 138 being mounted to upper surface 102U at a corner 102C of substrate 102, wherein a gap 148 exists between each segment 138.

By forming segmented stiffener ring 134 of segments 138 having gaps 148 therebetween, warpage of segmented stiffener ring 134 itself is reduced as compared to a continuous stiffener ring. This reduces the thermal stress applied by segmented stiffener ring 134 on to substrate 102 as compared to a continuous stiffener ring. This allows segmented stiffener ring 134 to be designed to minimize warpage of warpage control stiffener ring package 100.

Now in more detail, FIG. 1 is top plan view of a warpage control stiffener ring package 100 in accordance with one embodiment. FIG. 2 is a cross sectional view of warpage control stiffener ring package 100 of FIG. 1 along the line II-II in accordance with one embodiment. Referring now to FIGS. 1 and 2 together, warpage control stiffener ring package 100, sometimes called an electronic component package, includes a substrate 102.

Substrate 102 includes a substrate core 104 including an upper, e.g., first, surface 104U and an opposite lower, e.g., second, surface 104L. Substrate core 104 further includes sides 104S extending perpendicularly between upper surface 104U and lower surface 104L. Substrate core 104 is a dielectric material such as laminate, ceramic, printed circuit board material, or other dielectric material.

Although the terms parallel, perpendicular, and similar terms are used herein, it is to be understood that the described features may not be exactly parallel and perpendicular, but only substantially parallel and perpendicular to within accepted manufacturing tolerances.

Formed on upper surface 104U of substrate core 104 are electrically conductive upper, e.g., first, traces 106, e.g., formed of copper. Upper traces 106 include terminals 108, sometimes called bond fingers.

Formed on lower surface 104L of substrate core 104 are lower, e.g., second, traces 110. Lower traces 110 including electrically conductive lands 112.

Lower traces 110 are electrically connected to upper traces 106 by electrically conductive vias 114 extending through substrate core 104 between upper surface 104U and lower surface 104L.

In accordance with this embodiment, substrate 102 further includes a dielectric upper, e.g., first, solder mask 116 on upper surface 104U. Upper solder mask 116 protects, i.e., covers, first portions of upper traces 106 while exposing second portions, e.g., terminals 108, of upper traces 106.

Substrate 102 further includes a dielectric lower, e.g., second, solder mask 118 on lower surface 104L. Lower solder mask 118 protects, i.e., covers, first portions of lower traces 110 while exposing second portions, e.g., lands 112, of lower traces 110.

Upper and lower solder masks 116, 118 are optional, and in one embodiment, are not formed. Accordingly, although upper and lower solder masks 116, 118 are illustrated in the figures and discussed herein, in light of this disclosure, those of skill in the art will understand that the description is equally applicable to upper and lower surface 104U, 104L of substrate core 104 in the event that upper and lower solder masks 116, 118 are not formed.

Generally, substrate 102 includes an upper, e.g., first, surface 102U and an opposite lower, e.g., second, surface 102L. Upper surface 102U is defined by upper solder mask 116, by upper surface 104U of substrate core 104, and/or by any other structure which forms upper surface 102U of substrate 102. Similarly, lower surface 102L is defined by lower solder mask 118, by lower surface 104L of substrate core 104, and/or by any other structure which forms lower surface 102L of substrate 102.

Substrate 102 further includes sides 102S extending perpendicularly between upper surface 102U and lower surface 102L. Sides 102S intersect at corners 102C of substrate 102.

Although a particular electrically conductive pathway between upper traces 106 and lower traces 110 is described above, other electrically conductive pathways can be formed. For example, contact metallizations can be formed between the various electrical conductors.

Further, instead of straight though vias 114, in one embodiment, a multilayer substrate includes a plurality of vias and/or internal traces that form the electrical interconnection between upper traces 106 and lower traces 110.

In this embodiment, interconnection balls 120, e.g., solder balls, are formed on lands 112 to provide a Ball Grid Array (BGA). In another embodiment, interconnection balls 120 are not formed and lands 112 are distributed in an array thus forming a Land Grid Array (LGA). However, in other embodiment, other package configurations other than a LGA and a BGA are used.

Warpage control stiffener ring package 100 further includes an electronic component 122. Electronic component 122 is an integrated circuit chip, e.g., an active component including active circuitry. However, in other embodiments, electronic component 122 is a passive component such as a capacitor, resistor, or inductor.

Electronic component 122 includes an active surface 124 and an opposite inactive surface 126. Electronic component 122 further includes bond pads 128 on active surface 124.

Bond pads 128 are physically and electrically coupled to terminals 108 of upper traces 106 by flip chip bumps 130, e.g., solder bumps, copper pillars, or other electrically conductive bumps. Optionally, an underfill 132 is applied between active surface 124 and upper surface 102U of substrate 102 and encloses and protects flip chip bumps 130.

Although electronic component 122 is illustrated and discussed herein as being in a flip chip configuration, in other embodiments, electronic component is mounted in a different configuration and/or a stacked configuration with one or more electronic components.

In one specific embodiment, electronic component 122 is mounted in a wirebond configuration. For example, inactive surface 126 is mounted to upper surface 102U of substrate 102 with an adhesive and bond wires form the electrical interconnection between bond pads 128 and terminals 108. Optionally, electronic component 122 and the bond wires are enclosed in an encapsulant, e.g., a glob top encapsulant.

Warpage control stiffener package 100 further includes a segmented stiffener ring 134 and a stiffener ring adhesive 136. Stiffener ring adhesive 136 attaches, sometimes called adheres, mounts, or couples, segmented stiffener ring 134 to upper solder mask 116 and generally to upper surface 102U of substrate 102. Segmented stiffener ring 134 has a uniform thickness, i.e., in the vertical direction in FIG. 2.

In accordance with this embodiment, segmented stiffener ring 134 includes a plurality, e.g., two or more, of segments 138. More particularly, segmented stiffener ring 134 includes four segments 138. Segments 138 include a first segment 138A which shall be described in detail below and it is to be understood that the description is equally applicable to the other segments 138.

Segment 138A includes a body 140 and two legs 142A, 142B extending from body 140. Legs 142A, 142B are collectively referred to as legs 142 and a reference to a leg 142 can refer to either leg 142A or leg 142B.

Body 140 is mounted to upper surface 102U directly adjacent sides 102S of substrate 102 and at a corner 102C. Leg 142A is mounted to upper surface 102U and extends from body 140 along and adjacent a first side 102S of substrate 102. Similarly, leg 142B is mounted to upper surface 102U and extends from body 140 along and adjacent a second side 102S of substrate 102. Legs 142A, 142B extend from body 140 perpendicular to one another.

Segment 138A is sometimes said to be an "L" shaped segment. The length L1 that each leg 142 perpendicularly extends from the respective normal side 102S of substrate 102 is greater than the distance D1 between the same side 102S and the respective nearest parallel side 144 of electronic component 122. Stated another way, legs 142 overlap sides 144 of electronic component 122. More particularly, a hypothetical line 146 parallel to a side 144 intersects two different overlapping legs 142.

Each segment 138 is similar to segment 138A and include bodies 140 at respective corners 102C of substrate 102 and legs 142 extending therefrom. Collectively, segments 138 form a ring having gaps 148 therein. Stated another way, segmented stiffener ring 134 is formed of segments 138 having gaps 148 therebetween.

By forming segmented stiffener ring 134 of segments 138 having gaps 148 therebetween, warpage of segmented stiffener ring 134 itself is reduced as compared to a continuous stiffener ring. This reduces the thermal stress applied by segmented stiffener ring 134 on to substrate 102 as compared to a continuous stiffener ring. This allows segmented stiffener ring 134 to be designed to minimize warpage of warpage control stiffener ring package 100.

In one embodiment, segmented stiffener ring 134 is formed of a material having a higher thermal coefficient of expansion (TCE), also referred to as a coefficient of thermal expansion (CTE), than substrate 102. For example, substrate 102 is a laminate type substrate and segmented stiffener ring 134 is formed of copper, aluminum, stainless steel, e.g., 300 series stainless steel, or other material that has a higher TCE than substrate 102.

By forming segmented stiffener ring 134 to have a higher TCE than substrate 102, segmented stiffener ring 134 expands more rapidly than substrate 102 upon heating, and conversely, contracts more rapidly than substrate 102 upon cooling.

Further, in one embodiment, segmented stiffener ring 134 is formed of a material other than copper, which is a relatively heavy and expensive material. In this manner, the cost and weight of warpage control stiffener ring package 100 is minimized.

In one embodiment, to control warpage of warpage control stiffener ring package 100, warpage control stiffener ring package 100 including substrate 102 and segmented stiffener ring 134 are heated. Segmented stiffener ring 134 is mounted to substrate 102 with stiffener ring adhesive 136 while at the elevated temperature.

After mounting of segmented stiffener ring 134, warpage control stiffener ring package 100 is allowed to cool and return to room temperature. As segmented stiffener ring 134 has a greater TCE than substrate 102, segmented stiffener ring 134 contracts faster than substrate 102 upon cooling of warpage control stiffener ring package 100. This causes segmented stiffener ring 134 to pull up on corners 102C of substrate 102 towards segmented stiffener ring 134 thus minimizing the warpage of corners 102C downward. Of note, corners 102C of substrate 102 would bend downwards upon cooling absent segmented stiffener ring 134. In this manner, planarity, sometimes called flatness, of warpage control stiffener ring package 100 is maintained.

Although one specific example of segmented stiffener ring 134 is illustrated in FIGS. 1-2 and discussed above, generally, a segmented stiffener ring in accordance with various embodiments can be designed to minimize the warpage of any particular package. Various examples of segmented stiffener rings are discussed below, but in light of this disclosure, those of skill in the art will understand that the examples are illustrative only, and that other designs can be used depending upon the particular package application.

Referring just to FIG. 1 now, in one embodiment, a second continuous inner stiffener ring 150 is mounted to upper surface 102U of substrate 102 by an adhesive. Continuous inner stiffener ring 150 is indicated by dashed lines in FIG. 1 to indicate that continuous inner stiffener ring 150 is optional.

Continuous inner stiffener ring 150 is a continuous rectangular ring in accordance with this embodiment. As used herein, continuous means having an absence of breaks or gaps, and interrupted in space. Continuous inner stiffener ring 150 is formed of the same or similar material as segmented stiffener ring 134 in one embodiment.

Continuous inner stiffener ring 150 is located around the periphery of electronic component 122. More particularly, continuous inner stiffener ring 150 is located on upper surface 102U between electronic component 122 and segmented stiffener ring 134. Continuous inner stiffener ring 150 further stiffens warpage control stiffener ring package 100 and further minimizes warpage.

Figure 3:
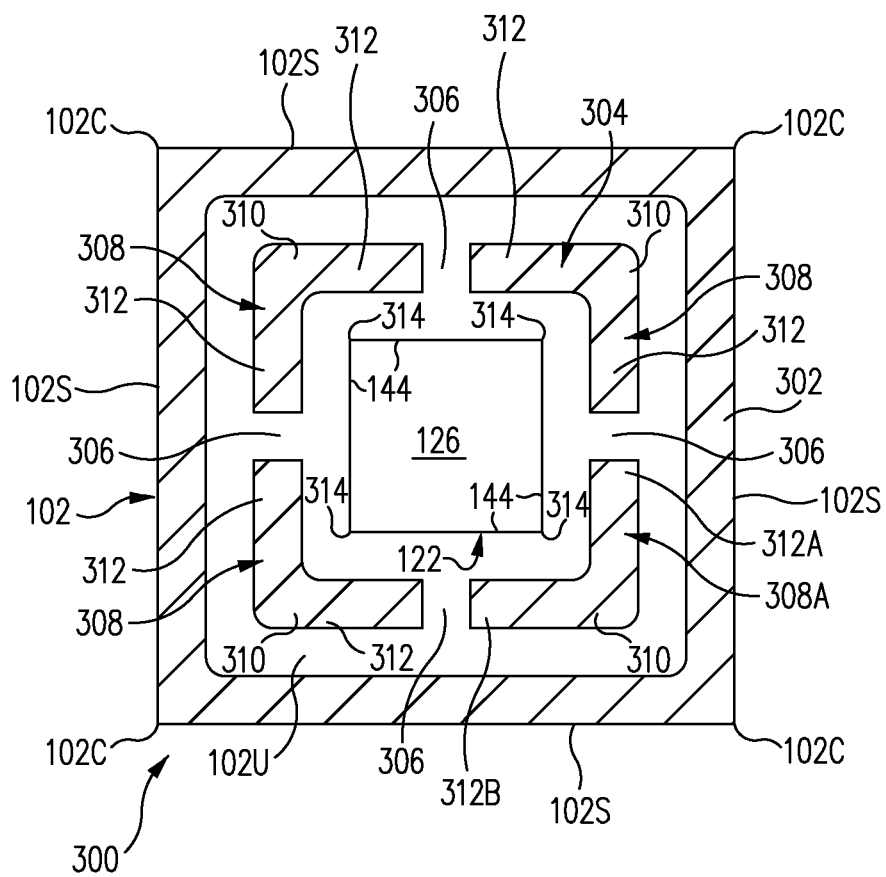
FIGS. 3, 4, 5, 6, 7, 8, 9, 10 are top plan views of warpage control stiffener ring packages in accordance with various embodiments.

FIG. 3 is a top plan view of a warpage control stiffener ring package 300 in accordance with another embodiment. Warpage control stiffener ring package 300 of FIG. 3 is similar to warpage control stiffener ring package 100 of FIG. 1 and only the significant differences are discussed below.

Referring now to FIG. 3, warpage control stiffener ring package 300 includes a continuous outer stiffener ring 302 and a segmented inner stiffener ring 304. Both rings 302, 304 are mounted to upper surface 102U of substrate 102 using adhesive.

Continuous outer stiffener ring 302 is a continuous rectangle adjacent sides 102S and generally on the periphery of upper surface 102U.

Segmented inner stiffener ring 304 is rectangular having gaps 306 therein. Segmented inner stiffener ring 304 is located on upper surface 102U of substrate 102 separated from and between continuous outer stiffener ring 302 and electronic component 122.

Segmented inner stiffener ring 304 includes a plurality, e.g., two or more, of segments 308 separated from one another by gaps 306. More particularly, segmented inner stiffener ring 304 includes four segments 308. Segments 308 include a first segment 308A which shall be described in detail below and it is to be understood that the description is equally applicable to the other segments 308.

Segment 308A includes a body 310 and two legs 312A, 312B extending from body 310. Body 310 is mounted to upper surface 102U adjacent corners 314 of electronic component 122. Leg 312A is mounted to upper surface 102U and extends from body 310 parallel to a first side 144 of electronic component 122. Similarly, leg 312B is mounted to upper surface 102U and extends from body 310 parallel to a second side 144 of electronic component 122. Legs 312A, 312B extend from body 310 perpendicular to one another. Sides 144 are parallel to sides 102S in this embodiment.

Segment 308A is sometimes said to be an "L" shaped segment. Each segment 308 is similar to segment 308A and include bodies 310 adjacent respective corners 314 of electronic component 122 and legs 312 extending therefrom. Collectively, segments 308 form a rectangular ring having gaps 306 therein. Stated another way, segmented inner stiffener ring 304 is formed of segments 308 having gaps 306 therebetween.

By forming segmented inner stiffener ring 304 of segments 308 having gaps 306 therebetween, the warpage of segmented inner stiffener ring 304, and thus the thermal stress applied by segmented inner stiffener ring 304 on to substrate 102, is reduced as compared to a continuous inner stiffener ring. This allows segmented inner stiffener ring 304 to be designed to minimize warpage of warpage control stiffener ring package 300.

In one embodiment, segmented inner stiffener ring 304 is formed of a material having a higher TCE than substrate 102. For example, substrate 102 is a laminate type substrate and segmented inner stiffener ring 304 is formed of copper, aluminum, stainless steel, e.g., 300 series stainless steel, or other material that has a higher TCE than substrate 102.

By forming segmented inner stiffener ring 304 to have a higher TCE than substrate 102, segmented inner stiffener ring 304 expands more rapidly than substrate 102 upon heating, and conversely, contracts more rapidly than substrate 102 upon cooling.

Figure 4:
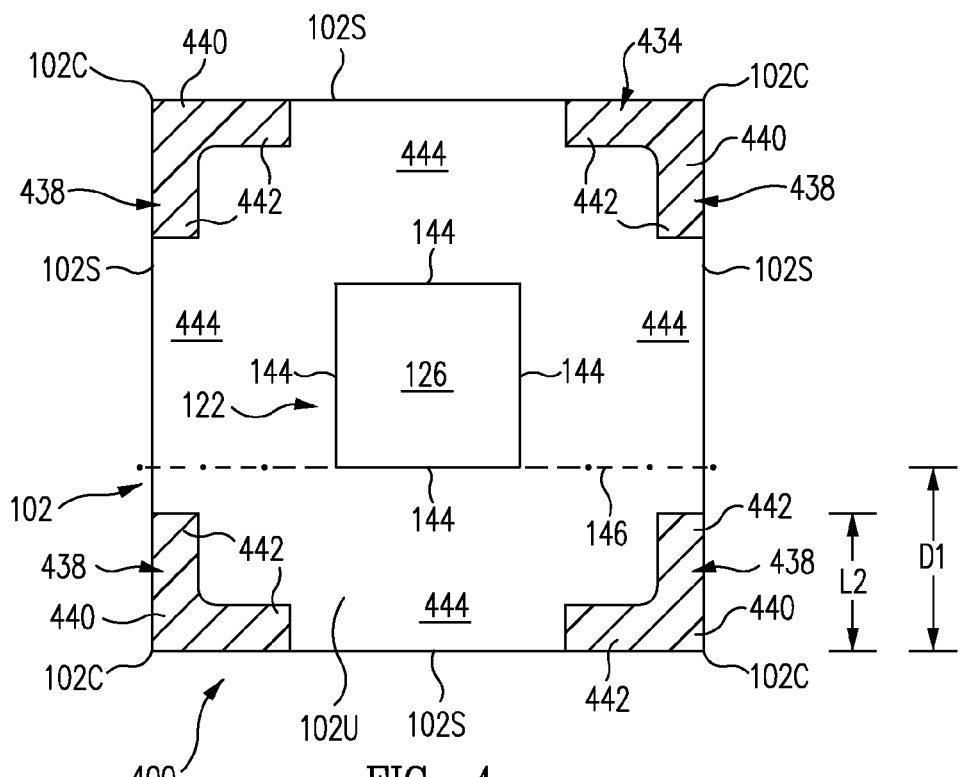

FIG. 4 is a top plan view of a warpage control stiffener ring package 400 in accordance with another embodiment. Warpage control stiffener ring package 400 of FIG. 4 is similar to warpage control stiffener ring package 100 of FIGS. 1-2 and only the significant differences are discussed below.

Referring now to FIGS. 1, 2, and 4 together, warpage control stiffener ring package 400 includes a segmented stiffener ring 434 having segments 438 separated by gaps 444. Segments 438 include bodies 440 and two legs 442 extending from each respective body 440.

Segmented stiffener ring 434 is similar to segmented stiffener ring 134 of FIGS. 1-2 except that the length of legs 442 of segmented stiffener ring 434 is less than the length of legs 142 of segmented stiffener ring 134. Stated another way, legs 442 are shorter than legs 142. Accordingly, gaps 444 of warpage control stiffener ring package 400 of FIG. 4 are larger than gaps 148 of warpage control stiffener ring package 100 of FIGS. 1-2.

Warpage control stiffener ring package 400 provides an example of how a segmented stiffener ring can be modified to control warpage for a particular package. In particular, by increasing gaps 444 as compared to gaps 148 of FIG. 1, segmented stiffener ring 434 of FIG. 4 applies less force to substrate 102 as compared to segmented stiffener ring 134 of FIGS. 1-2.

The length L2 that each leg 442 perpendicularly extends from the respective normal side 102S of substrate 102 is less than the distance D1 between the same side 102S and the respective nearest parallel side 144 of electronic component 122. Stated another way, legs 442 do not overlap sides 144 of electronic component 122. More particularly, a hypothetical line 146 parallel to a side 144 misses legs 442 and generally segmented stiffener ring 434.

Figure 5:
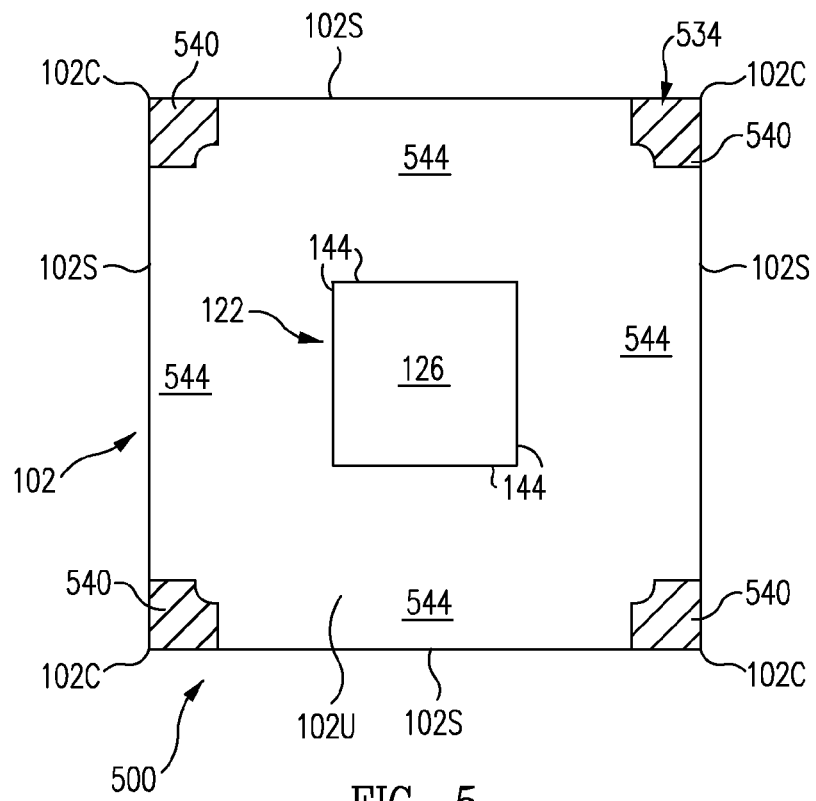

FIG. 5 is a top plan view of a warpage control stiffener ring package 500 in accordance with another embodiment. Warpage control stiffener ring package 500 of FIG. 5 is similar to warpage control stiffener ring package 100 of FIGS. 1-2 and only the significant differences are discussed below.

Referring now to FIGS. 1, 2, and 5 together, warpage control stiffener ring package 500 includes a segmented stiffener ring 534 similar to segmented stiffener ring 134 of warpage control stiffener ring package 100. However, segmented stiffener ring 534 is formed of bodies 540 only, i.e., has an absence of legs. Accordingly, gaps 544 of warpage control stiffener ring package 500 are much larger than gaps 148 of warpage control stiffener ring package 100. More particularly, segmented stiffener ring 534 is formed at corners 102C of substrate 102 only.

Warpage control stiffener ring package 500 provides another example of how a segmented stiffener ring can be modified to control warpage for a particular package. In particular, by forming segmented stiffener ring 534 at corners 102C of substrate 102 only, segmented stiffener ring 534 of FIG. 5 applies less force to substrate 102 as compared to segmented stiffener ring 134 of FIGS. 1-2. Specifically, segmented stiffener ring 534 applies force at corners 102C of substrate 102 only.

As set forth above, by varying the length of legs of a segmented stiffener ring, the warpage counteracting force of the segmented stiffener ring can be adjusted and optimized for a particular package. As described further below, in another embodiment, the width of legs of a segmented stiffener ring, and generally, the width of a segmented stiffener ring, or parts thereof, can be adjusted to also adjust and optimize the warpage counteracting force applied by a segmented stiffener ring. In yet another embodiment, the thickness and/or material of a segmented stiffener ring can be adjusted to also adjust and optimize the warpage counteracting force applied by a segmented stiffener ring.

Figure 6:
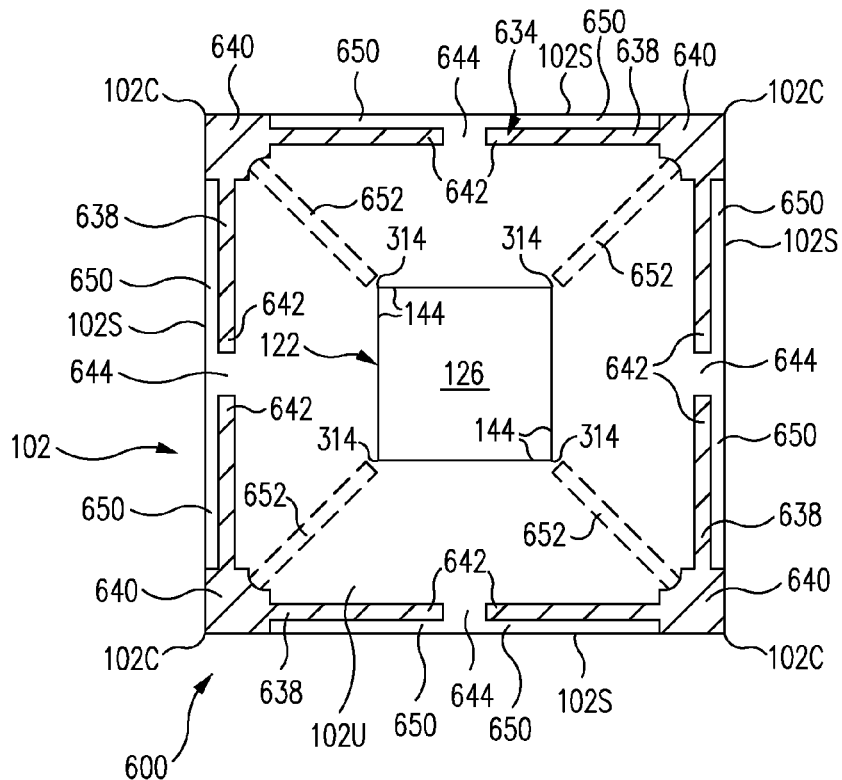

FIG. 6 is a top plan view of a warpage control stiffener ring package 600 in accordance with another embodiment. Warpage control stiffener ring package 600 of FIG. 6 is similar to warpage control stiffener ring package 100 of FIGS. 1-2 and only the significant differences are discussed below.

Referring now to FIGS. 1, 2, and 6 together, warpage control stiffener ring package 600 includes a segmented stiffener ring 634 having segments 638 separated by gaps 644. Segments 638 include bodies 640 and two legs 642 extending from each respective body 640.

Segmented stiffener ring 634 is similar to segmented stiffener ring 134 of FIGS. 1-2 except that the width of legs 642 of segmented stiffener ring 634 is less than the width of legs 142 of segmented stiffener ring 134. Stated another way, legs 642 are thinner than legs 142. More particularly, a small space 650 exists between each leg 642 and the respective side 102S of substrate 102.

Warpage control stiffener ring package 600 provides an example of how a segmented stiffener ring can be modified to control warpage for a particular package. In particular, by making legs 642 thinner as compared to legs 142 of FIG. 1, segmented stiffener ring 634 of FIG. 6 applies less force to substrate 102 as compared to segmented stiffener ring 134 of FIGS. 1-2.

In one embodiment, segmented stiffener ring 634 further includes one or more diagonal legs 652 as indicated by the dashed lines. Diagonal legs 652 extend from bodies 640 in an angled direction relative to sides 102S of substrate 102. In this particular embodiment, diagonal legs 652 extend from bodies 640 toward respective corners 314 of electronic component 122.

Although diagonal legs 652 are discussed above and illustrated, in light of this disclosure, those of skill in the art will understand that segmented stiffener ring 634, or any of the segmented stiffener rings as disclosed herein, can be formed with additional extensions or other features to control warpage of a warpage control stiffener ring package depending upon the particular design.

Figure 7:
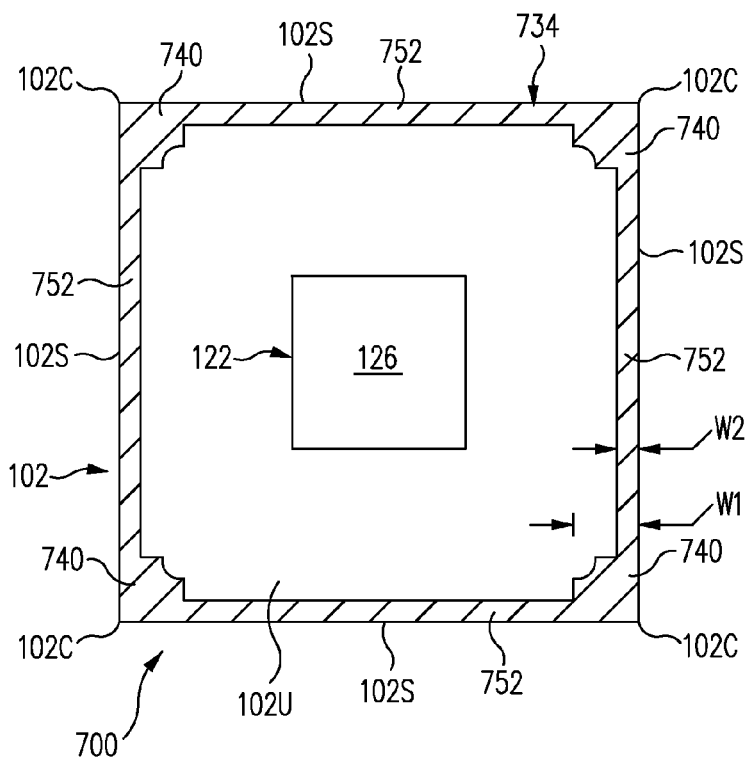

FIG. 7 is a top plan view of a warpage control stiffener ring package 700 in accordance with another embodiment. Warpage control stiffener ring package 700 of FIG. 7 is similar to warpage control stiffener ring package 100 of FIGS. 1-2 and only the significant differences are discussed below.

Referring now to FIGS. 1, 2, and 7 together, warpage control stiffener ring package 700 includes a continuous stiffener ring 734 around the entire periphery of upper surface 102U of substrate 102. Continuous stiffener ring 734 includes bodies 740 and extensions 752 connecting bodies 740. A width W1 of bodies 740 is greater than a width W2 of extensions 752.

By forming thin extensions 752, the warpage counteracting force of continuous stiffener ring 734 is reduced as compared to a uniform width continuous stiffener ring.

Figure 8:
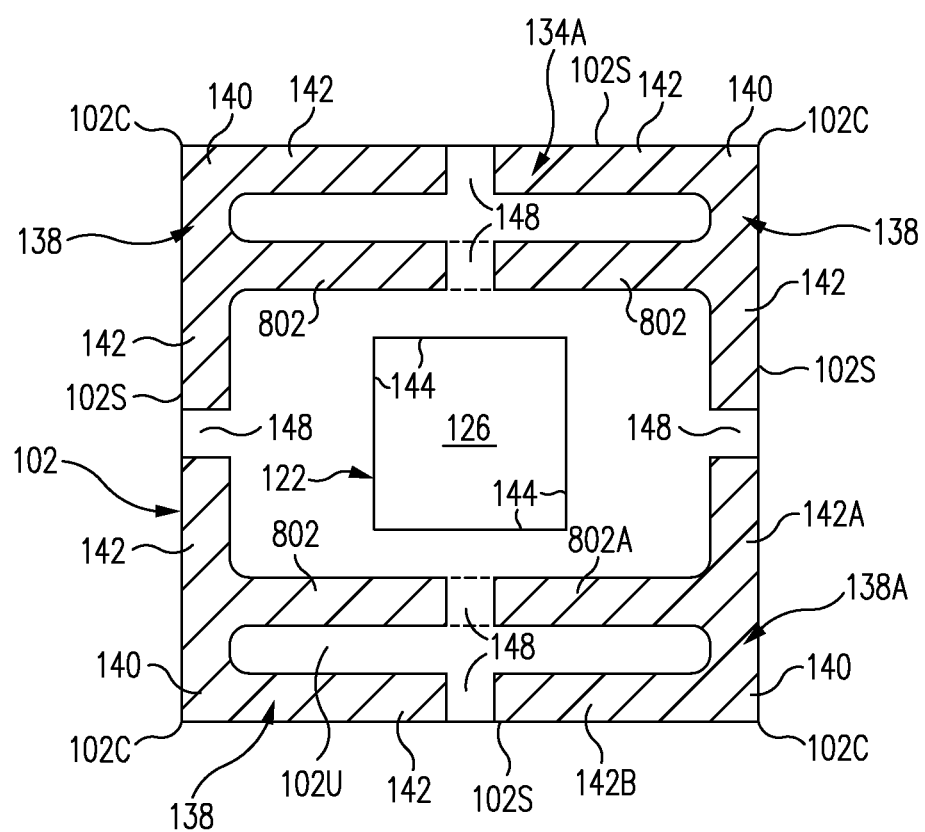

FIG. 8 is a top plan view of a warpage control stiffener ring package 800 in accordance with another embodiment. Warpage control stiffener ring package 800 of FIG. 8 is similar to warpage control stiffener ring package 100 of FIGS. 1-2 and only the significant differences are discussed below.

Referring now to FIGS. 1, 2, and 8 together, warpage control stiffener ring package 800 includes a segmented stiffener ring 134A. Segmented stiffener ring 134A as illustrated in FIG. 8 is similar or identical to segmented stiffener ring 134 as illustrated in FIG. 1 except that segmented stiffener ring 134A includes fingers 802.

More particularly, each segment 138 includes a finger 802. Fingers 802 extend horizontally in the view of FIG. 8 towards one another from opposite segments 138. Gap 148 exists between respective fingers 802.

To more specifically illustrate, a first finger 802A of fingers 802 extends from leg 142A of segment 138A. Finger 802A is parallel to leg 142B. Further, finger 802A is located between leg 142B and electronic component 122. The other fingers 802 extend from the other respective legs 142 of the other respective segments 138 is a similar manner.

By forming fingers 802, the surface area of segmented stiffener ring 134A is increased as compared segmented stiffener ring 134 as illustrated in FIGS. 1-2. This allows the warpage control force applied by segmented stiffener ring 134A on substrate 102 to be increased as compared to segmented stiffener ring 134.

As indicated by the dashed lines in FIG. 8, in yet another embodiment, fingers 802 are connected together to form cross member similar to cross members 1020 as described below in reference to FIG. 10.

Figure 9:
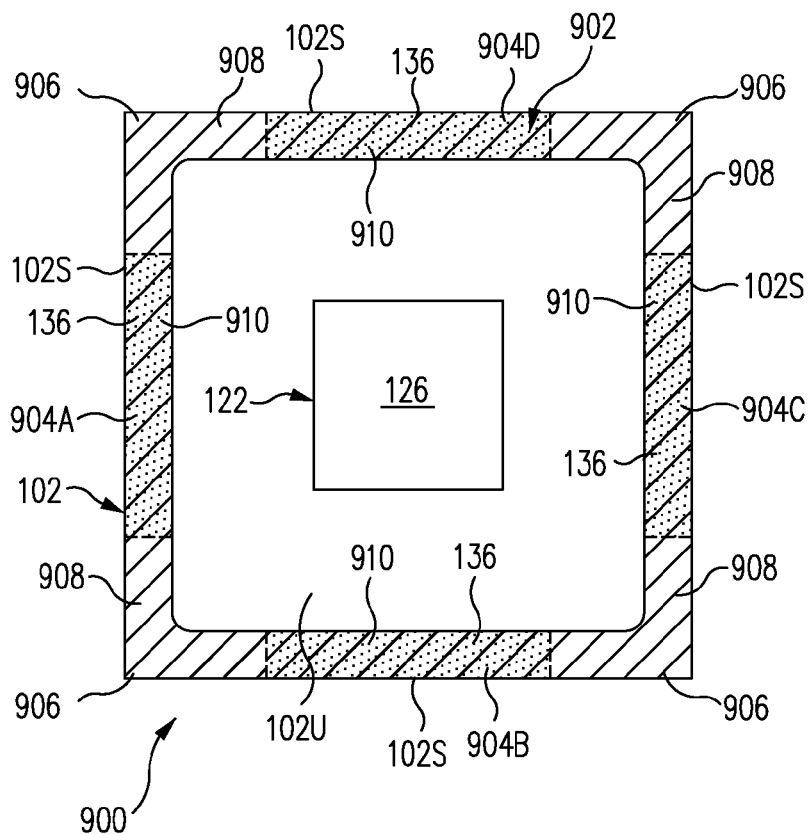

FIG. 9 is a top plan view of a warpage control stiffener ring package 900 in accordance with another embodiment. Warpage control stiffener ring package 900 of FIG. 9 is similar to warpage control stiffener ring package 100 of FIGS. 1-2 and only the significant differences are discussed below.

Referring now to FIG. 9, warpage control stiffener ring package 900 includes a partially adhered continuous stiffener ring 902. Partially adhered continuous stiffener ring 902 is a continuous rectangle adjacent sides 102S and generally on the periphery of upper surface 102U.

Partially adhered continuous stiffener ring 902 includes four sides 904A, 904B, 904C, 904D, collectively sides 904. Sides 904 intersect and are connected to one another at corners 906 of partially adhered continuous stiffener ring 902.

Sides 904A, 904C are opposite and parallel to one another. Sides 904B, 904D are also opposite and parallel to one another. Sides 904A, 904C are perpendicular to sides 904B, 904D.

Partially adhered continuous stiffener ring 902 is only partially, not completely, adhered to upper surface 102U of substrate 102. More particularly, to reduce the force applied by partially adhered continuous stiffener ring 902 on substrate 102, non-adherent corner portions 908 of partially adhered continuous stiffener ring 902 are not adhered to upper surface 102U of substrate 102.

However, adherent side portions 910 are adhered to upper surface 102U of substrate 102 using stiffener ring adhesive 136. Stiffener ring adhesive 136 is shown as dark shading for clarity of presentation but it is to be understood that stiffener ring adhesive 136 ordinarily would not visible in the view of FIG. 9.

Non-adherent corner portions 908 include corners 906 and portions of sides 904 adjacent corners 906. Adherent side portions 910 are the center portions of sides 904 and extend between non-adherent corner portions 908.

As non-adherent corner portions 908 are not adhered, attached, or otherwise coupled to, sometimes called decoupled from or un-adhered to, upper surface 102U, non-adherent corner portions 908 are free to move relative to upper surface 102U. Accordingly, non-adherent corner portions 908 do not apply force, or apply a minimal force, to substrate 102 as warpage control stiffener ring package 900 thermally expands and contracts.

In contrast, adherent side portions 910 are adhered to, sometimes called attached or coupled to, upper surface 102U. Thus, adherent side portions 910 apply a force to upper surface 102U.

By selectively adhering partially adhered continuous stiffener ring 902 to upper surface 102U as described above, the overall force applied by partially adhered continuous stiffener ring 902 to substrate 102 is reduced as compared to adhering the entire partially adhered continuous stiffener ring 902 to upper surface 102U.

Further, by increasing or decreasing the size of non-adherent corner portions 908, the warpage counteracting force applied can be selectively controlled and tailored for a particular design.

Figure 10:
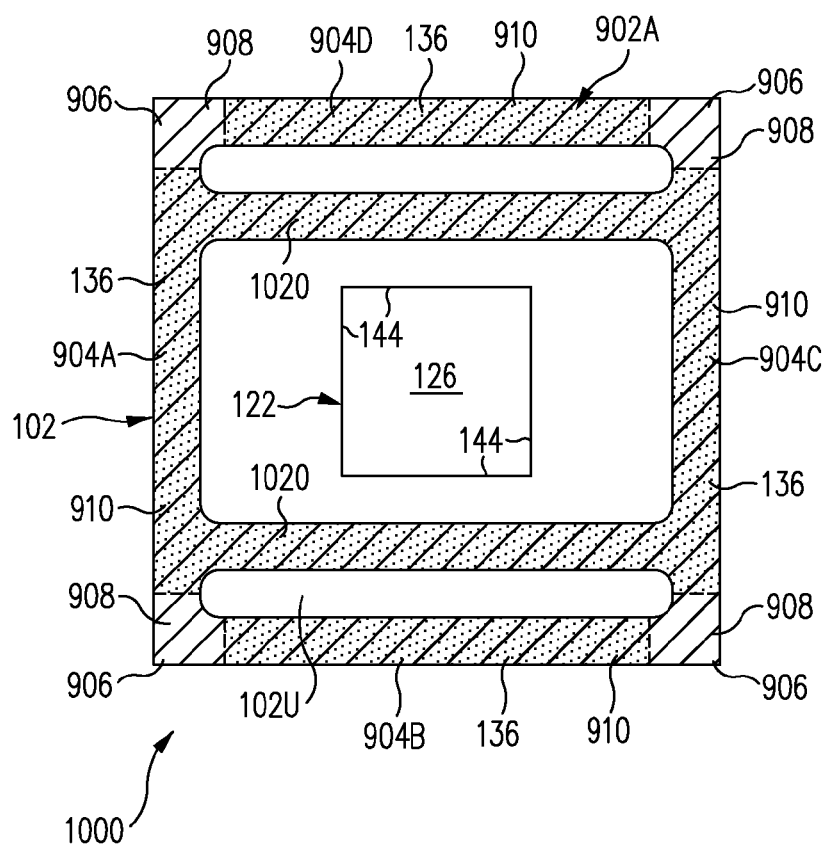

FIG. 10 is a top plan view of a warpage control stiffener ring package 1000 in accordance with another embodiment. Warpage control stiffener ring package 1000 of FIG. 10 is similar to warpage control stiffener ring package 900 of FIG. 9 and only the significant differences are discussed below.

Referring now to FIG. 10, warpage control stiffener ring package 1000 includes a partially adhered continuous stiffener ring 902A substantially similar to partially adhered continuous stiffener ring 902 as described above. However, partially adhered continuous stiffener ring 902A includes cross members 1020 that are completely adhered to upper surface 102U by stiffener ring adhesive 136. Stiffener ring adhesive 136 is shown as dark shading for clarity of presentation but it is to be understood that stiffener ring adhesive 136 ordinarily would not visible in the view of FIG. 10.

More particularly, cross members 1020 extend between and are connected to opposite sides 904A, 904C. Cross members 1020 are parallel to sides 904B, 904D. Further, cross members 1020 are located between sides 904B, 904D and electronic component 122.

By forming cross members 1020, the overall strength of partially adhered continuous stiffener ring 902A is increased as compared to partially adhered continuous stiffener ring 902 of FIG. 9. Further, the force of partially adhered continuous stiffener ring 902A on upper surface 102U is greater than partially adhered continuous stiffener ring 902 of FIG. 9 due to the increased amount of force applied by cross members 1020.

In light of this disclosure, those of skill in the art will understand that continuous inner stiffener ring 150 as illustrated in FIG. 1 or segmented inner stiffener ring 304 as illustrated in FIG. 3 can be incorporated into any of the warpage control stiffener packages described above.

FIG. 11 is a side perspective view of a segmented stiffener ring 134B in accordance with another embodiment. FIG. 12 is an enlarged perspective view of a segment 138 of segmented stiffener ring 134B of FIG. 11 in accordance with one embodiment.

Segmented stiffener ring 134B including segment 138 of FIGS. 11 and 12 are similar to segmented stiffener ring 134 including segments 138 of FIGS. 1 and 2 and only the significant differences are discussed below.

Referring now to FIGS. 1, 2, 11 and 12, segmented stiffener ring 134B has varying thickness. Thickness means the dimension in the vertical direction in the view of FIGS. 11 and 12 and perpendicular to upper surface 102U of substrate 102 (substrate 102 is illustrated in FIG. 2).

More particularly, segmented stiffener ring 134B has a first thickness T1 at bodies 140 and tapers to a second thickness T2 at ends 1160 of legs 142. First thickness T1 is the maximum thickness of segmented stiffener ring 134B. First thickness T1 is greater than second thickness T2 at ends 1160 of legs 142. Second thickness T2 is the minimum thickness of segmented stiffener ring 134B.

Stated another way, the thickness of segmented stiffener ring 134B varies along the length of segmented stiffener ring 134B. The length is the direction parallel to upper surface 102U of substrate 102.

Segmented stiffener ring 134B provides an example of how the thickness of a segmented stiffener ring can be adjusted to adjust and optimize the warpage counteracting force applied by a segmented stiffener ring. More particularly, by making segmented stiffener ring 134B thicker at the corners, i.e., at bodies 140, segmented stiffener ring 134B applies more warpage counteracting force at corners 102C of substrate 102 and less near the middle of sides 102S of substrate 102. Specifically, segmented stiffener ring 134B is thickest at corners 102C of substrate 102 and tapers to be thinner away from corners 102C of substrate 102.

Although one example of a varying thickness segmented stiffener ring 134B is provided, the thickness is varied differently in other embodiments. For example, bodies 140 may be thicker yet legs 142 may have a uniform thickness. In another example, a segmented stiffener ring may be thickest at ends 1160 of legs 142 and taper to a thin body 140. Other examples are possible.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. A structure comprising:
    a substrate comprising:
        a rectangular upper surface; and
        corners;
    a uniform thickness segmented stiffener ring comprising a plurality of segments, each segment of the plurality of segments coupled to the upper surface of the substrate at a respective corner of the substrate, wherein a gap exists between each segment of the plurality of segments.

2. The structure of claim 1 wherein a thermal coefficient of expansion of the segmented stiffener ring is greater than a thermal coefficient of expansion of the substrate.

3. The structure of claim 1 wherein each segment of the plurality of segments is L-shaped.

4. The structure of claim 1 wherein the segmented stiffener ring pulls the corners towards the segmented stiffener ring upon cooling.

5. The structure of claim 1 further comprising an integrated circuit chip coupled to the substrate.

6. The structure of claim 1 wherein each segment of the plurality of segments comprises a body at a respective corner of the substrate.

7. The structure of claim 6 wherein each segment of the plurality of segments further comprises a plurality of legs extending from the body.

8. The structure of claim 7 comprising a respective space on the upper surface of the substrate between each of the plurality of legs and a respective side of the substrate.

9. The structure of claim 7 wherein each segment further comprises a finger extending from a leg of the plurality of legs.

10. A structure comprising:
    a substrate comprising:
        an upper surface; and
        corners;

a uniform thickness segmented stiffener ring comprising segments, each segment being coupled to the upper surface at a corner of the substrate, wherein a gap exists between each segment;
an electronic component coupled to the substrate; and
an inner stiffener ring between the segmented stiffener ring and the electronic component.

11. The structure of claim 10 wherein the inner stiffener ring is segmented.

12. The structure of claim 10 wherein the inner stiffener ring is continuous.

13. A structure comprising:
a substrate comprising:
a rectangular upper surface; and
corners;
a partially adhered continuous stiffener ring coupled to the upper surface, the partially adhered continuous stiffener ring comprising:
non-adherent corner portions at the corners of the substrate, the non-adherent corner portions being un-adhered to the upper surface of the substrate; and
adherent side portions adhered to the upper surface of the substrate.

14. The structure of claim 13 wherein the non-adherent corner portions are free to move relative to the upper surface.

15. The structure of claim 13 wherein the partially adhered continuous stiffener ring comprises a rectangular ring adjacent sides of the substrate.

16. The structure of claim 15 wherein the partially adhered continuous stiffener ring comprises corners and sides, the non-adherent corner portions comprising the corners of the partially adhered continuous stiffener ring and portions of the sides adjacent the corners of the partially adhered continuous stiffener ring.

17. The structure of claim 15 wherein the adherent side portions comprise center portions of the sides of the partially adhered continuous stiffener ring.

18. A structure comprising:
a substrate comprising:
an upper surface; and
corners;
a partially adhered continuous stiffener ring coupled to the upper surface, the partially adhered continuous stiffener ring comprising:
non-adherent corner portions at the corners, the non-adherent corner portions being un-adhered to the upper surface; and
adherent side portions adhered to the upper surface; and
a stiffener ring adhesive coupling the adherent side portions to the upper surface.

19. A structure comprising:
a substrate comprising:
an upper surface; and
corners;
a segmented stiffener ring comprising segments, each segment being coupled to the upper surface at a corner of the substrate, wherein a gap exists between each segment, the segmented stiffener ring varying in thickness along a length of the segmented stiffener ring.

20. The structure of claim 19 wherein the segmented stiffener ring is thickest at the corners of the substrate.

21. The structure of claim 20 wherein the segmented stiffener ring tapers to become thinner away from the corners of the substrate.

22. A structure comprising:
a substrate comprising:
an upper surface; and
corners;
a partially adhered continuous stiffener ring coupled to the upper surface, the partially adhered continuous stiffener ring comprising:
non-adherent corner portions at the corners, the non-adherent corner portions being un-adhered to the upper surface; and
adherent side portions adhered to the upper surface; and
a first cross member extending between a first of the adherent side portions and a second of the adherent side portions.

23. The structure of claim 22, further comprising:
a second cross member extending between the first of the adherent side portions and the second of the adherent side portions; and
an electronic component coupled to the substrate between the first and second cross members.

\* \* \* \* \*